(12) United States Patent
Jochi

(10) Patent No.: US 12,431,413 B2
(45) Date of Patent: Sep. 30, 2025

(54) SEMICONDUCTOR PACKAGE AND SEMICONDUCTOR DEVICE

(71) Applicant: Mitsubishi Electric Corporation, Tokyo (JP)

(72) Inventor: Masafumi Jochi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 662 days.

(21) Appl. No.: 17/852,498

(22) Filed: Jun. 29, 2022

(65) Prior Publication Data

US 2023/0178463 A1 Jun. 8, 2023

(30) Foreign Application Priority Data

Dec. 7, 2021 (JP) ................................. 2021-198300

(51) Int. Cl.
*H01L 23/495* (2006.01)
*H01L 23/00* (2006.01)
(Continued)

(52) U.S. Cl.
CPC ...... *H01L 23/49568* (2013.01); *H01L 23/293* (2013.01); *H01L 23/3107* (2013.01);
(Continued)

(58) Field of Classification Search
CPC ......... H01L 23/49544; H01L 23/49551; H01L 23/49555; H01L 23/367; H01L 23/49568; H01L 23/3107
See application file for complete search history.

(56) References Cited

U.S. PATENT DOCUMENTS

2011/0156229 A1 6/2011 Shinohara
2017/0077019 A1* 3/2017 Sugaya ................. H01G 4/228
(Continued)

FOREIGN PATENT DOCUMENTS

JP S63-009153 U 1/1988
JP H06-085153 A 3/1994
(Continued)

OTHER PUBLICATIONS

Machine translation, Ishikawa, Japanese Pat. Pub. No. JP2002305279A, translation date: Mar. 5, 2025, Espacenet, all pages. (Year: 2025).*
(Continued)

*Primary Examiner* — Victoria K. Hall
(74) *Attorney, Agent, or Firm* — Studebaker Brackett PLLC

(57) ABSTRACT

A semiconductor package includes: a semiconductor chip; a plurality of terminals connected to the semiconductor chip; and insulating sealing resin sealing the semiconductor chip and parts of the plurality of terminals, wherein an upper surface of the sealing resin is a flat heat radiation surface, the plurality of terminals respectively protrude from first and second side surfaces of the sealing resin that oppose each other, a distal end portion of each terminal has a substrate bonding surface positioned below a lower surface of the sealing resin, each terminal includes at least two bending portions existing below the heat radiation surface and bent downward, and angles of the bending portions are obtuse angles.

21 Claims, 8 Drawing Sheets

(51) Int. Cl.
  *H01L 23/29* (2006.01)
  *H01L 23/31* (2006.01)
  *H01L 23/367* (2006.01)
  *H01L 23/40* (2006.01)
  *H01L 23/498* (2006.01)
  *H01L 25/11* (2006.01)
  *H01L 25/16* (2023.01)
  *H01L 25/07* (2006.01)
  *H01L 25/18* (2023.01)

(52) U.S. Cl.
  CPC ........ *H01L 23/367* (2013.01); *H01L 23/3675* (2013.01); *H01L 23/4006* (2013.01); *H01L 23/49555* (2013.01); *H01L 23/49562* (2013.01); *H01L 23/498* (2013.01); *H01L 23/562* (2013.01); *H01L 25/115* (2013.01); *H01L 25/165* (2013.01); *H01L 23/49575* (2013.01); *H01L 24/48* (2013.01); *H01L 25/072* (2013.01); *H01L 25/18* (2013.01); *H01L 2224/48137* (2013.01); *H01L 2224/48245* (2013.01)

(56) References Cited

U.S. PATENT DOCUMENTS

| | | | |
|---|---|---|---|
| 2021/0225721 A1* | 7/2021 | Liu | H01L 23/49555 |
| 2023/0109471 A1* | 4/2023 | Ishimatsu | H01L 23/49555 257/666 |

FOREIGN PATENT DOCUMENTS

| | | | | |
|---|---|---|---|---|
| JP | H6-283642 A | * | 10/1994 | H05K 3/3421 |
| JP | H06-283642 A | | 10/1994 | |
| JP | 2002-305279 A | * | 10/2002 | H01L 23/50 |
| JP | 2011-134990 A | | 7/2011 | |
| JP | 2012-209469 A | | 10/2012 | |
| JP | 2013-069737 A | | 4/2013 | |

OTHER PUBLICATIONS

Machine translation, Fujiwara, Japanese Pat. Pub. No. JPH06283642A, translation date: Mar. 5, 2025, Espacenet, all pages. (Year: 2025).*
"Notice of Reasons for Refusal" Office Action issued in JP 2021-198300; mailed by the Japanese Patent Office on Oct. 8, 2024.

* cited by examiner

SEMICONDUCTOR PACKAGE AND SEMICONDUCTOR DEVICE

CROSS-REFERENCE TO RELATED APPLICATION

The entire disclosure of Japanese Patent Application No. 2021-198300, filed on Dec. 7, 2021, including specification, claims, drawings and summary, on which the convention priority of the present application is based, is incorporated herein by reference in its entirety.

BACKGROUND OF THE INVENTION

Field

The present disclosure relates to a semiconductor package and a semiconductor device.

Background

A semiconductor package for driving a small-capacity domestic/industrial motor has generally adopted a transfer mold type and insertion mounted type external shape from the necessity of radiating heat appropriately for its amount of heat generation. A conventional surface mounted type semiconductor package has formed a U-shaped bending portion having an acute bending angle in a lead terminal (see, e.g., JPH06-085153A (FIG. 2)). The U-shaped bending portion of the lead terminal is elastically deformed, to prevent a large stress from acting on a soldered portion of the lead terminal.

SUMMARY

In recent years, a request to reduce the size and the cost of a substrate in a system to be loaded with a semiconductor package for motor driving has become increasingly strong, and an increase in output capability relative to an external size of the package has been required. In such a motion, an increase in output capacity of a surface mounted type semiconductor package conventionally used only for a small-capacity application such as a fan motor and attachment of a heat sink have been attempted. However, in a conventional technique, a U-shaped bending portion of a lead terminal has been arranged to be higher than an upper surface of the package. This has made it impossible to appropriately bring the heat sink into contact with the upper surface of the package because the lead terminal contacts the heat sink and has made it impossible to obtain a good heat radiation property.

In view of the above-described problems, an object of the present disclosure is to provide a semiconductor package and a semiconductor device having a good heat radiation property.

A semiconductor package according to the present disclosure includes: a semiconductor chip; a plurality of terminals connected to the semiconductor chip; and insulating sealing resin sealing the semiconductor chip and parts of the plurality of terminals, wherein an upper surface of the sealing resin is a flat heat radiation surface, the plurality of terminals respectively protrude from first and second side surfaces of the sealing resin that oppose each other, a distal end portion of each terminal has a substrate bonding surface positioned below a lower surface of the sealing resin, each terminal includes at least two bending portions existing below the heat radiation surface and bent downward, and angles of the bending portions are obtuse angles.

In the present disclosure, each terminal includes the at least two bending portions bent downward. Angles of the bending portions are obtuse angles. When the heat sink is attached, the bending portions are respectively elastically deformed when a downward stress is applied to a heat radiation surface of the sealing resin with a distal end portion of each terminal fixed. Accordingly, the terminal can have a sufficient elastic deformation width in a height direction. Therefore, contact between the heat radiation surface of the sealing resin and the heat sink is appropriately maintained. Thus, a good heat radiation property can be obtained.

Other and further objects, features and advantages of the invention will appear more fully from the following description.

DESCRIPTION OF EMBODIMENTS

A semiconductor package and a semiconductor device according to the embodiments of the present disclosure will be described with reference to the drawings. The same components will be denoted by the same symbols, and the repeated description thereof may be omitted.

First Embodiment

Figure 1:
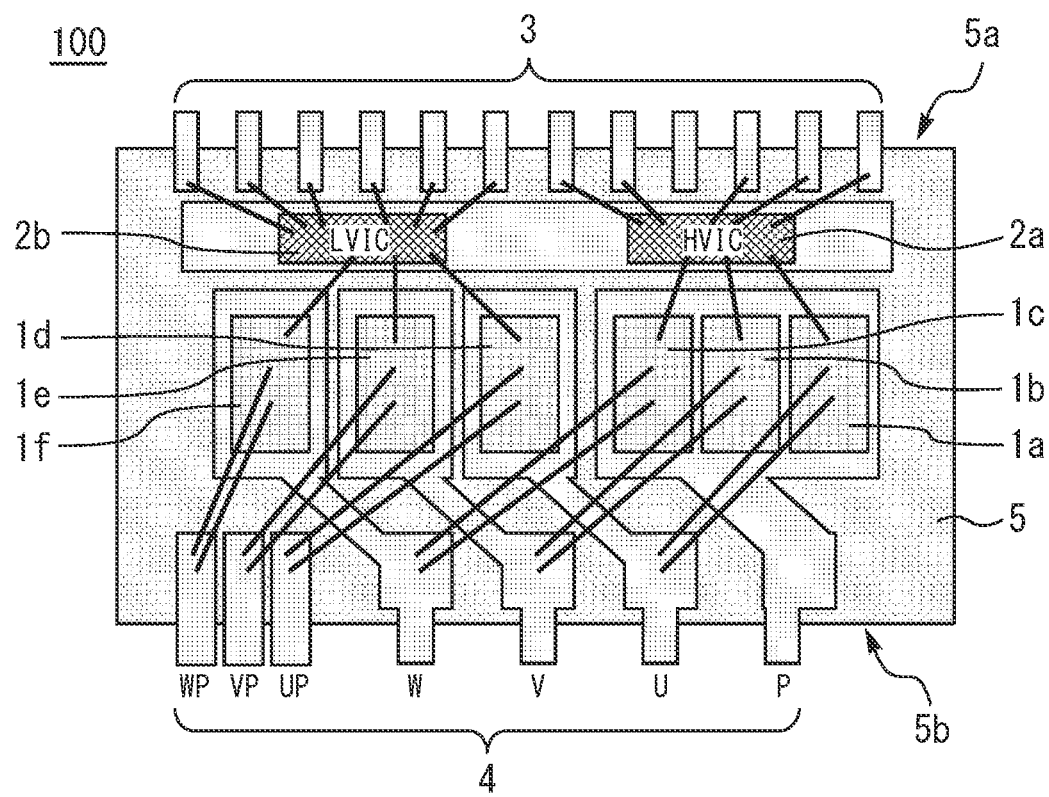
FIG. 1 is a plan view illustrating the interior of a semiconductor package according to a first embodiment.

FIG. 1 is a plan view illustrating the interior of a semiconductor package according to a first embodiment. The semiconductor package 100 is a three-phase inverter for motor driving, and is of a surface mounted type. Semiconductor chips 1a to 1f are each a power semiconductor chip such as an IGBT, a MOSFET, or a Di.

A driving IC chip 2a is wire-connected to respective control terminals of the high-side semiconductor chips 1a to 1c. A driving IC chip 2b is wire-connected to respective control terminals of the low-side semiconductor chips 1d to 1f. The driving IC chips 2a and 2b are each wire-connected to a plurality of control terminals 3. The driving IC chip 2a drives the high-side semiconductor chips 1a to 1c. The driving IC chip 2b drives the low-side semiconductor chips 1d to 1f.

The semiconductor chips 1a to 1c are mounted on a P-phase main terminal 4. The semiconductor chips 1d to 1f are respectively mounted on U-, V-, and W-phase main terminals 4. The semiconductor chips 1a to 1f are respectively wire-connected to U-, V-, W-, UP-, VP-, and WP-phase main terminals 4.

Sealing resin 5 such as epoxy resin seals the semiconductor chips 1a to 1f, the driving IC chips 2a and 2b, a part of each of the control terminals 3, and a part of each of the main terminals 4 with a transfer mold. An external shape of the sealing resin 5 is rectangular in planar view, and has a first side surface 5a and a second side surface 5b that oppose each other, respectively, as long sides. The plurality of control terminals 3 protrude from the first side surface 5a. The plurality of main terminals 4 protrude from the second side surface 5b. The semiconductor chips 1a to 1f and the driving IC chips 2a and 2b are connected to the exterior by the control terminals 3 and the main terminals 4 that protrude from the sealing resin 5. Each of the main terminals 4 performs output of a current to a motor or connection to a high voltage power source. Each of the control terminals 3 inputs a motor driving signal, inputs a protection signal, outputs an error signal, and supplies an IC driving power source, for example.

Figure 2:
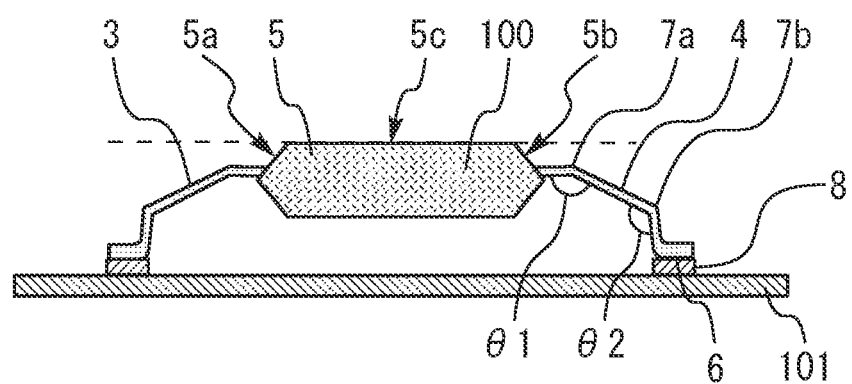
FIG. 2 is a side view illustrating the semiconductor package according to the first embodiment.

FIG. 2 is a side view illustrating the semiconductor package according to the first embodiment. An upper surface of the sealing resin 5 is a flat heat radiation surface. Respective distal end portions of the main terminal 4 and the control terminal 3 have substrate bonding surfaces 6 positioned below a lower surface of the sealing resin 5. The respective substrate bonding surfaces 6 of the plurality of main terminals 4 and the plurality of control terminals 3 are positioned at the same height.

The main terminal 4 and the control terminal 3 exist below a heat radiation surface 5c. Each of the main terminal 4 and the control terminal 3 includes at least two bending portions 7a and 7b bent downward. Respective angles θ1 and θ2 of the bending portions 7a and 7b are obtuse angles. Each of the substrate bonding surfaces 6 of the semiconductor package is bonded to an electrode of a substrate 101 with a bonding material 8 such as a solder interposed therebetween.

Figure 3:
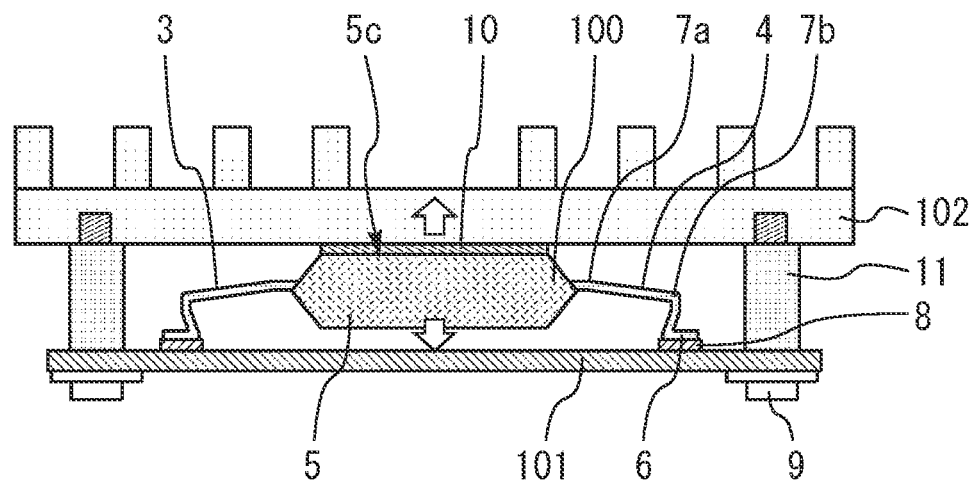
FIG. 3 is a side view illustrating a semiconductor device according to the first embodiment.

FIG. 3 is a side view illustrating a semiconductor device according to the first embodiment. A heat sink 102 is attached to the heat radiation surface 5c of the semiconductor package 100. A heat radiation grease 10 or an insulating heat radiation resin sheet, for example, is provided as a heat transfer member between the heat radiation surface 5c and the heat sink 102.

The heat sink 102 is fixed to the substrate 101 with a screw 9. An external shape of the sealing resin 5 is pressed downward by tightening the screw 9. Thus, the main terminal 4 and the control terminal 3 in the semiconductor package 100 are elastically deformed. The heat radiation surface 5c of the sealing resin 5 is pressed against the heat sink 102 with respective repulsive forces of the main terminal 4 and the control terminal 3 elastically deformed.

A spacer 11 having an appropriate height is inserted between the heat sink 102 and the substrate 101 such that the lower surface of the sealing resin 5 does not contact the substrate 101 after the screw 9 is tightened. Although the spacer 11 is provided in a portion of the screw 9, the present disclosure is not limited to this. As long as the substrate 101 and the heat sink 102 can be held with an appropriate spacing, the screw 9 may be provided in another location.

In a conventional technique, the number of bending portions of each of terminals is only one. Only the one bending portion is elastically deformed. Accordingly, an elastic deformation width in a height direction is small. On the other hand, in the present embodiment, each of the main terminal 4 and the control terminal 3 includes the at least two bending portions 7a and 7b bent downward. The respective angles θ1 and θ2 of the bending portions 7a and 7b are obtuse angles. When the heat sink 102 is attached, the two bending portions 7a and 7b are respectively elastically deformed when a downward stress is applied to the heat radiation surface 5c of the sealing resin 5 with the distal end portion of each of the terminals fixed. Accordingly, the main terminal 4 and the control terminal 3 can have a sufficient elastic deformation width in a height direction. Therefore, contact between the heat radiation surface 5c of the sealing resin 5 and the heat sink 102 is appropriately maintained. Thus, a good heat radiation property can be obtained.

Each of the main terminal 4 and the control terminal 3 exists below the heat radiation surface 5c and does not have a portion above the heat radiation surface 5c. Accordingly, a part of each of the main terminal 4 and the control terminal 3 does not contact the heat sink 102. Thus, the heat sink 102 can be appropriately brought into contact with the heat radiation surface 5c.

In the conventional technique, a direction in which the bending portion is deformed is limited to a transverse direction. Accordingly, elasticity in a longitudinal direction is not exerted, whereby a height cannot be adjusted. On the other hand, in the present embodiment, the at least two bending portions 7a and 7b are elastically deformed so that elasticity in a longitudinal direction is exerted, whereby a height can be adjusted. Accordingly, semiconductor packages respectively having different heights can be mounted on the same heat sink 102.

Figure 4:
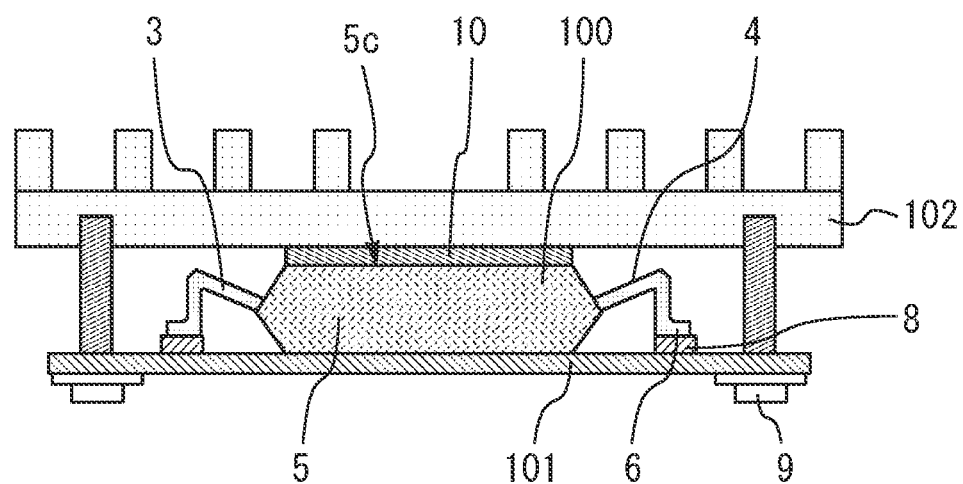
FIG. 4 is a side view illustrating a semiconductor device according to a comparative example.

FIG. 4 is a side view illustrating a semiconductor device according to a comparative example. A heat sink of a large size is required to radiate heat of a surface mounted type semiconductor package the amount of heat radiation of which has increased by increasing its output capacity. In a conventional DIP-shaped semiconductor device, an external shape of sealing resin has been screwed. However, the weight of the heat sink is supported by a soldered portion of a terminal, resulting in a problem that the soldered portion deteriorates by vibration at the time of a system operation. In the comparative example, a heat sink 102 is fixed to a substrate 101 with a screw 9. If the semiconductor package is mounted at a normal height, a spacing between an upper surface of the substrate 101 and a lower surface of sealing resin 5 is as small as approximately 0.5 mm, and both the surfaces contact each other when a screw is tightened. In the case of a surface mounted type, the semiconductor package is generally mounted such that the lower surface of the sealing resin floats from the substrate so that a stress is not transmitted to an external shape of the sealing resin at the time of occurrence of bending of the substrate, for example. On the other hand, in the present embodiment, the main terminal 4 and the control terminal 3 respectively have the sufficient elastic deformation widths in the height direction, as described above. Accordingly, the semiconductor package 100 can be mounted such that a height of the heat radiation surface 5c and a height of the lower surface of the sealing resin 5 from the substrate 101 increase. Even when the heat sink 102 is fixed to the substrate 101 with the screw 9, the lower surface of the sealing resin 5 is maintained in a state floating from the substrate 101. Accordingly, a stress to the semiconductor package 100 from the substrate 101 can be relieved.

Figure 5:
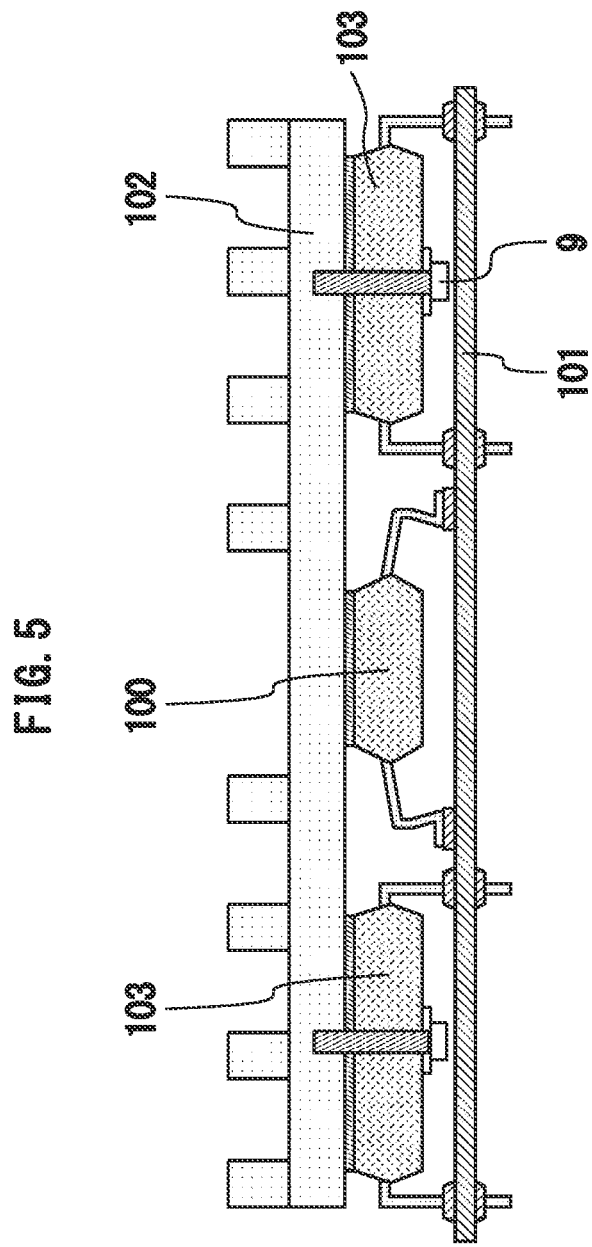
FIG. 5 is a side view illustrating a modification of the semiconductor device according to the first embodiment.

FIG. 5 is a side view illustrating a modification of the semiconductor device according to the first embodiment. Not only a semiconductor package 100 according to the present embodiment but also another device 103 requiring heat radiation such as a diode module may be mounted on a substrate 101 to share a heat sink 102. The other device 103 is fixed to the heat sink 102 with a screw 9. In a state where the heat sink 102 has not been attached yet, a heat radiation surface 5c of the semiconductor package 100 is made higher than a heat radiation surface of the other device 103. As a result, screwing and a spacer for the semiconductor package 100 are not required, thereby making it possible to reduce a mounting cost and a member cost.

Second Embodiment

Figure 6:
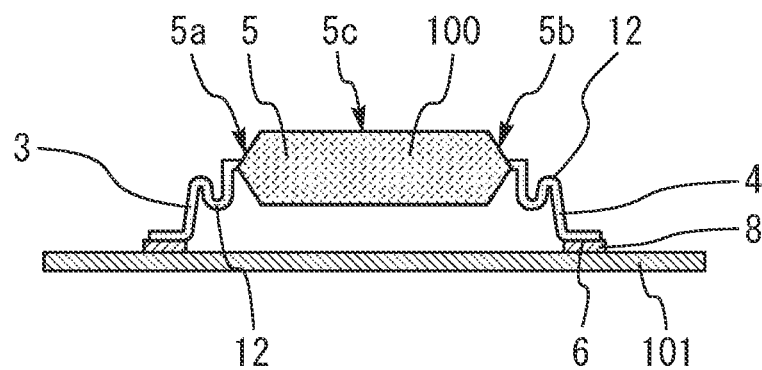
FIG. 6 is a side view illustrating a semiconductor device according to a second embodiment.

FIG. 6 is a side view illustrating a semiconductor device according to a second embodiment. A root portion of each of a main terminal 4 and a control terminal 3 that protrude in a transverse direction from a side surface of sealing resin 5 is provided with a folded portion 12. The folded portion 12 has a shape such as a U, S, V, or concave shape folded in a longitudinal direction.

In the first embodiment, when an attempt to ensure the height of the semiconductor package is made, the main terminal 4 and the control terminal 3 transversely protrude. Accordingly, a mounting area on the substrate 101 increases. On the other hand, in the present embodiment, the main terminal 4 and the control terminal 3 are respectively provided with the folded portions 12. Even if the folded portions 12 are provided, an amount of transverse protrusion of each of the main terminal 4 and the control terminal 3 is small. Accordingly, a mounting area hardly increases.

When a heat sink 102 is attached, the folded portion 12 is elastically deformed when a downward stress is applied to a heat radiation surface 5c of sealing resin 5 with a distal end portion of each of the terminals fixed. As a result, a mounting area on a substrate 101 is reduced, whereby an adjustment margin of a mounting height can be enlarged. Even in a case where an external surface of the sealing resin 5 is not horizontal, for example, a case where the substrate 101 is deflected, the heat sink 102 can be appropriately brought into contact with the heat radiation surface 5c. Other components and effects are similar to those in the first embodiment.

If the folded portion 12 has a V shape, an angle formed between two inclined portions constituting the V shape is preferably 30 degrees or more. When the angle is thus widened, the main terminal 4 and the control terminal 3 are easily elastically deformed.

Figure 7:
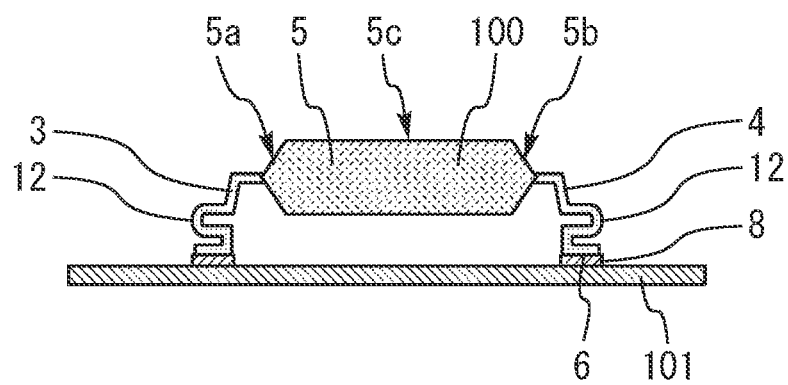
FIG. 7 is a side view illustrating a modification 1 of the semiconductor device according to the second embodiment.
Figure 8:
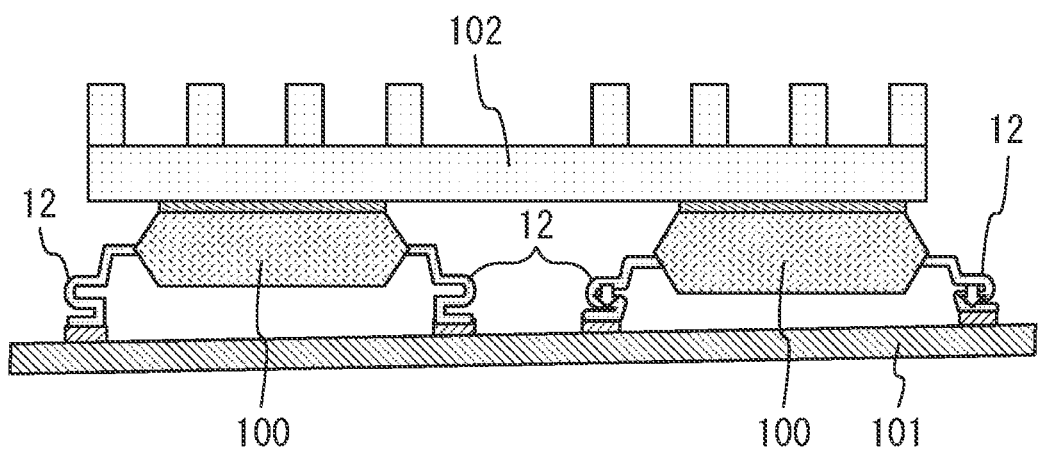
FIG. 8 is a side view illustrating a modification 1 of the semiconductor device according to the second embodiment.

FIGS. 7 and 8 are side views each illustrating a modification 1 of the semiconductor device according to the second embodiment. A folded portion 12 is provided in a downward extending portion of each of a main terminal 4 and a control terminal 3, and has a shape such as a U, S, V, or concave shape folded in a transverse direction. As a result, a semiconductor package can be mounted with its height kept. A stress to be applied when a heat sink 102 is attached is not easily applied in a shear direction of soldering (in the transverse direction in the figure). Accordingly, the reliability of a soldered portion is improved. A mounting area can be further reduced.

As illustrated in FIG. 8, two semiconductor packages 100 can also be arranged side by side and bonded to a substrate 101 to share a heat sink 102. When the heat sink 102 is pressed against respective heat radiation surfaces 5c of the two semiconductor packages 100 and is fixed, respective folded portions 12 of a main terminal 4 and a control terminal 3 in each of the two semiconductor packages 100 are elastically deformed. Thus, the respective heights of the heat radiation surfaces 5c of the two semiconductor packages 100 are made uniform. Accordingly, the heat radiation surfaces 5c of the two semiconductor packages 100 need not be uniform in height when bonded to the substrate 101. Even if a spacing between the substrate 101 and the heat sink 102 is not uniform, an amount of elastic deformation of the folded portion 12 of each of the terminals is adjusted. Thus, the heat sink 102 can be appropriately brought into contact with the respective heat radiation surfaces 5c of the two semiconductor packages 100.

Figure 9:
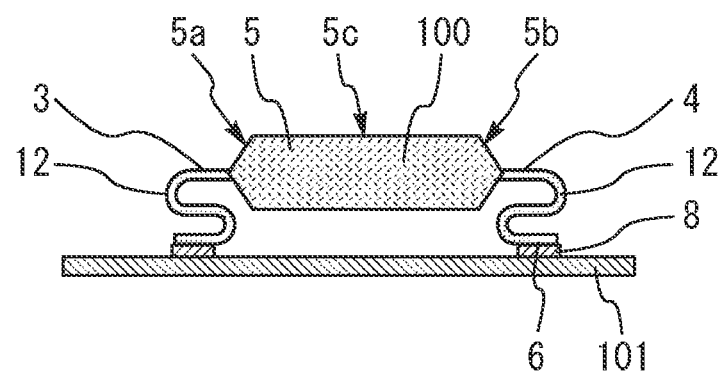
FIG. 9 is a side view illustrating a modification 2 of the semiconductor device according to the second embodiment.
Figure 10:
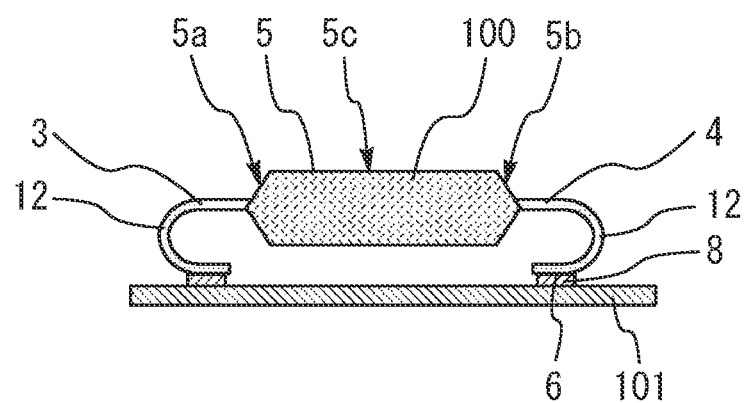
FIG. 10 is a side view illustrating a modification 3 of the semiconductor device according to the second embodiment.

FIG. 9 is a side view illustrating a modification 2 of the semiconductor device according to the second embodiment. An entire shape of each of a main terminal 4 and a control terminal 3 is an S-shaped folded portion 12. FIG. 10 is a side view illustrating a modification 3 of the semiconductor device according to the second embodiment. An entire shape of each of a main terminal 4 and a control terminal 3 is a transverse U-shaped folded portion 12. If respective shapes of the main terminal 4 and the control terminal 3 are thus simple, the main terminal 4 and the control terminal 3 are easily processed.

Third Embodiment

Figure 11:
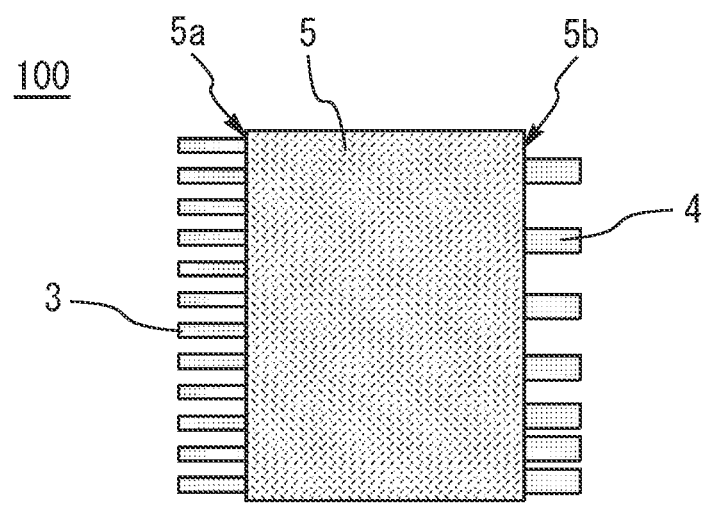
FIG. 11 is a top view illustrating a semiconductor package according to a third embodiment.

FIG. 11 is a top view illustrating a semiconductor package according to a third embodiment. The width of a main terminal 4 protruding from a second side surface 5b is larger than the width of a control terminal 3 protruding from a first side surface 5a. Therefore, the control terminal 3 has a low modulus of elasticity, and is elastically deformed.

Figure 12:
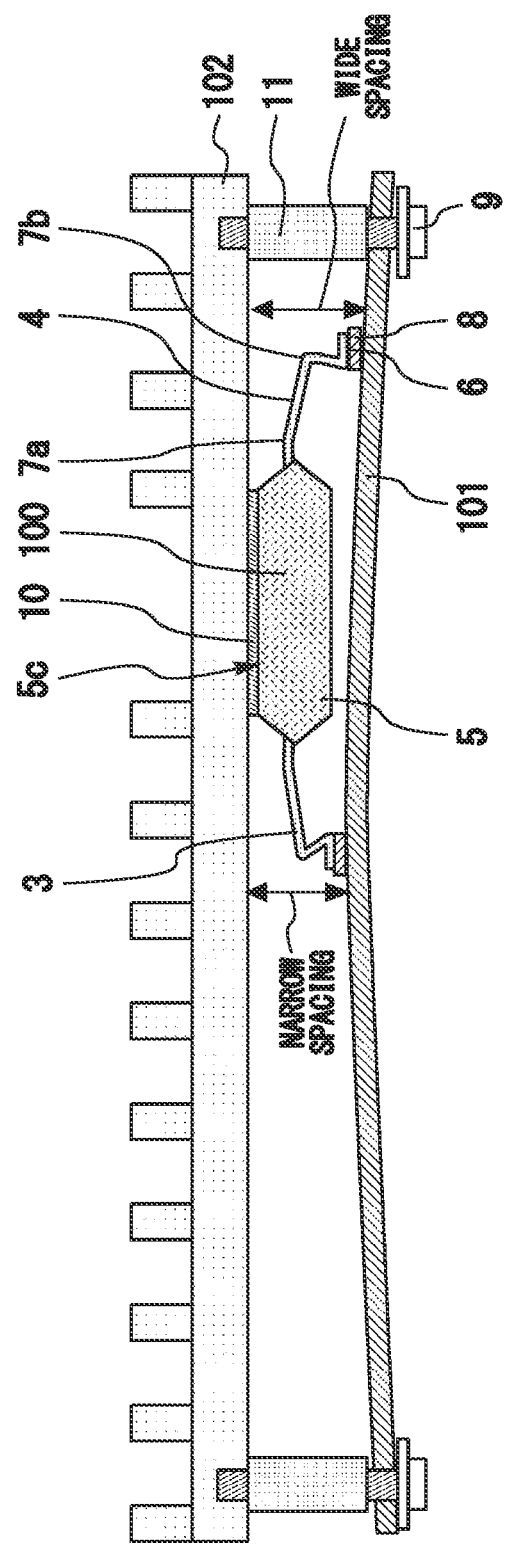
FIG. 12 is a side view illustrating a semiconductor device according to the third embodiment.

FIG. 12 is a side view illustrating a semiconductor device according to the third embodiment. Both ends of a substrate 101 is attached to a heat sink 102 with a spacer 11 interposed therebetween. At an attachment position, a spacing between the substrate 101 and the heat sink 102 is ensured by the spacer 11. On the other hand, the substrate 101 is deflected, whereby the spacing between the substrate 101 and the heat sink 102 is narrow in a central portion of the substrate 101. A mounting direction of the semiconductor package is set such that the control terminal 3 is located on the narrower side of the spacing. Therefore, the spacing between the substrate 101 and the heat sink 102 on the control terminal 3 side is narrower than the spacing between the substrate 101 and the heat sink 102 on the main terminal 4 side.

Generally, the substrate 101 is deflected and is not flat. Thus, the substrate 101 and an attachment plane of the heat sink 102 may not be parallel to each other. When the deflection of the substrate 101 is large, contact between a heat radiation surface 5c of the semiconductor package and the heat sink 102 may be unable to be approximately maintained. A direction in which the substrate 101 is easily deflected is previously grasped, to set the mounting direction of the semiconductor package such that the control terminal 3 is oriented toward the narrower side of the spacing between the substrate 101 and the heat sink 102. As a result, the main terminal 4 and the control terminal 3 are elastically deformed to correspond to a difference in the spacing between the substrate 101 and the heat sink 102 so that appropriate contact between the heat radiation surfaces 5c of the semiconductor package and the heat sink 102 can be maintained.

A material for the main terminal 4 and a material for the control terminal 3 may be made to differ in modulus of elasticity. For example, the main terminal 4 and the control terminal 3 are respectively made of Fe (iron) and Cu (copper). In this case, the modulus of elasticity of the main terminal 4 is larger than that of the control terminal 3 The materials for the main terminal 4 and the control terminal 3 are not limited to such a combination, but may be respectively materials having different moduli of elasticity. The mounting direction of the semiconductor package is set such that the terminal having the lower modulus of elasticity is oriented toward the narrower side of the spacing between the substrate 101 and the heat sink 102. As a result, even in a case where a surface of sealing resin 5 is not horizontal, for example, a case where the substrate 101 is deflected, appropriate contact between the heat radiation surface 5c of the semiconductor package and the heat sink 102 can be maintained.

An external shape of the sealing resin 5 is not firmly fixed with a screw or the like. Accordingly, the external shape of the sealing resin 5 resonates when vibration has occurred during a system operation, whereby there may occur defects such as respective damages to the main terminal 4 and the control terminal 3 and detachment of a soldered portion. The control terminal 3 and the main terminal 4 may be respectively made to have different shapes. As a result, respective resonance frequencies of the terminals differ from each other. Accordingly, the defects can be prevented by suppressing overall resonance vibration.

Fourth Embodiment

Figure 13:
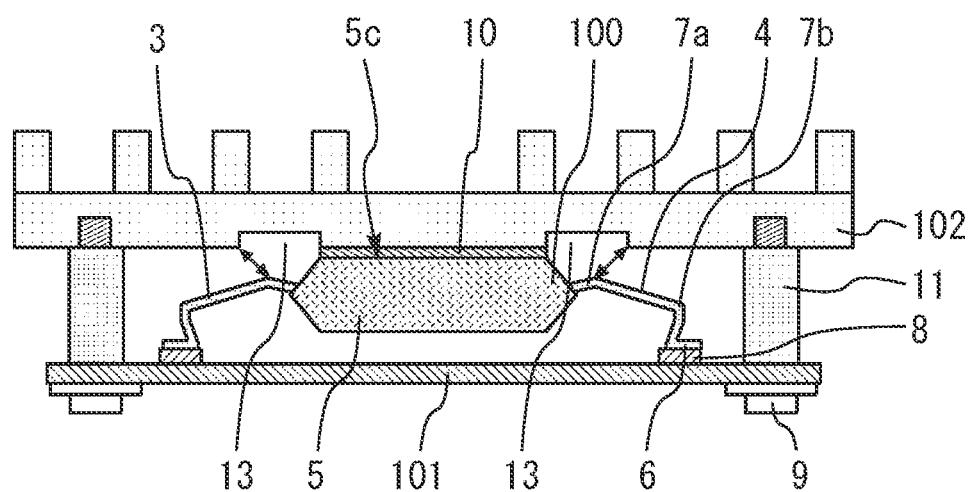
FIG. 13 is a side view illustrating a semiconductor device according to a fourth embodiment.

FIG. 13 is a side view illustrating a semiconductor device according to a fourth embodiment. When a heat sink 102 is attached, a main terminal 4 and a control terminal 3 are elastically deformed to come closer to a surface of the heat sink 102. In the present embodiment, the heat sink 102 is provided with a groove 13 in a portion opposing each of the main terminal 4 and the control terminal 3 of a semiconductor package 100. As a result, a specific insulation distance can be ensured between each of the control terminal 3 and the main terminal 4 elastically deformed and the heat sink 102 made of a metal.

The semiconductor chips 1a to 1f are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present disclosure are possible in the light of the above teachings. It is therefore to be understood that within the scope of the appended claims the invention may be practiced otherwise than as specifically described.

The invention claimed is:

1. A semiconductor package comprising:
   a semiconductor chip;
   a plurality of terminals connected to the semiconductor chip; and
   insulating sealing resin sealing the semiconductor chip and parts of the plurality of terminals,
   wherein an upper surface of the sealing resin is a flat heat radiation surface,
   the plurality of terminals respectively protrude from first and second side surfaces of the sealing resin that oppose each other,
   a distal end portion of each terminal has a substrate bonding surface positioned below a lower surface of the sealing resin,
   each terminal includes at least two bending portions existing below the heat radiation surface and bent downward,
   angles of the bending portions are obtuse angles,
   the plurality of terminals include a control terminal protruding from the first side surface, and a main terminal protruding from the second side surface, and
   a material for the main terminal and a material for the control terminal are different in modulus of elasticity.

2. The semiconductor package according to claim 1, wherein the bending portions are capable of being elastically deformed when a downward stress is applied to the heat radiation surface of the sealing resin with the distal end portion of each terminal fixed.

3. The semiconductor package according to claim 1, wherein the plurality of terminals include a control terminal protruding from the first side surface, and a main terminal protruding from the second side surface and having a width larger than a width of the control terminal.

4. The semiconductor package according to claim 1, wherein the plurality of terminals include a control terminal protruding from the first side surface, and a main terminal protruding from the second side surface, and
   the control terminal and the main terminal have different shapes.

5. The semiconductor package according to claim 1, wherein the semiconductor chip is made of a wide-band-gap semiconductor.

6. A semiconductor package comprising:
   a semiconductor chip;
   a plurality of terminals connected to the semiconductor chip; and
   insulating sealing resin sealing the semiconductor chip and parts of the plurality of terminals,
   wherein an upper surface of the sealing resin is a flat heat radiation surface,
   the plurality of terminals respectively protrude from first and second side surfaces of the sealing resin that oppose each other,
   a distal end portion of each terminal has a substrate bonding surface positioned below a lower surface of the sealing resin,
   each terminal exists below the heat radiation surface and includes a folded portion,
   the plurality of terminals include a control terminal protruding from the first side surface, and a main terminal protruding from the second side surface, and
   a material for the main terminal and a material for the control terminal are different in modulus of elasticity.

7. The semiconductor package according to claim 6, wherein the folded portion has a U, S, V, or concave shape.

8. The semiconductor package according to claim 6, wherein the folded portions are capable of being elastically deformed when a downward stress is applied to the heat radiation surface of the sealing resin with a distal end portion of each terminal fixed.

9. The semiconductor package according to claim 6, wherein the folded portion is provided at a root portion of the terminal protruding from the sealing resin and has a shape folded in a longitudinal direction.

10. The semiconductor package according to claim 6, wherein the folded portion has a V shape, and an angle formed between two inclined portions constituting the V shape is 30 degrees or more.

11. The semiconductor package according to claim 6, wherein the folded portion is provided in a downward extending portion of the terminal and has a shape folded in a transverse direction.

12. The semiconductor package according to claim 6, wherein an entire shape of the terminal is S shape or a transverse U-shape.

13. The semiconductor package according to claim 6, wherein the plurality of terminals include a control terminal protruding from the first side surface, and a main terminal protruding from the second side surface and having a width larger than a width of the control terminal.

14. The semiconductor package according to claim 6, wherein the plurality of terminals include a control terminal protruding from the first side surface, and a main terminal protruding from the second side surface, and
the control terminal and the main terminal have different shapes.

15. The semiconductor package according to claim 6, wherein the semiconductor chip is made of a wide-band-gap semiconductor.

16. A semiconductor device comprising:
the semiconductor package according to claim 3;
a substrate bonded to the substrate bonding surface of the semiconductor package with a bonding material interposed therebetween; and
a heat sink attached to the heat radiation surface of the semiconductor package,
wherein a spacing between the substrate and the heat sink on the control terminal side is narrower than a spacing between the substrate and the heat sink on the main terminal side.

17. A semiconductor device comprising:
the semiconductor package according to claim 13;
a substrate bonded to the substrate bonding surface of the semiconductor package with a bonding material interposed therebetween; and
a heat sink attached to the heat radiation surface of the semiconductor package,
wherein a spacing between the substrate and the heat sink on the control terminal side is narrower than a spacing between the substrate and the heat sink on the main terminal side.

18. A semiconductor device comprising:
the semiconductor package according to claim 1;
a substrate bonded to the substrate bonding surface of the semiconductor package with a bonding material interposed therebetween; and
a heat sink attached to the heat radiation surface of the semiconductor package,
wherein the heat sink is provided with a groove in a portion opposing the terminal of the semiconductor package.

19. A semiconductor device comprising:
a semiconductor package comprising:
a semiconductor chip;
a plurality of terminals connected to the semiconductor chip; and
insulating sealing resin sealing the semiconductor chip and parts of the plurality of terminals,
wherein
an upper surface of the sealing resin is a flat heat radiation surface,
the plurality of terminals respectively protrude from first and second side surfaces of the sealing resin that oppose each other,
a distal end portion of each terminal has a substrate bonding surface positioned below a lower surface of the sealing resin,
each terminal includes at least two bending portions existing below the heat radiation surface and bent downward,
angles of the bending portions are obtuse angles, and
the plurality of terminals include a control terminal protruding from the first side surface, and a main terminal protruding from the second side surface and having a width larger than a width of the control terminal;
a substrate bonded to the substrate bonding surface of the semiconductor package with a bonding material interposed therebetween; and
a heat sink attached to the heat radiation surface of the semiconductor package,
wherein a spacing between the substrate and the heat sink on the control terminal side is narrower than a spacing between the substrate and the heat sink on the main terminal side.

20. A semiconductor device comprising:
a semiconductor package comprising:
a semiconductor chip;
a plurality of terminals connected to the semiconductor chip; and
insulating sealing resin sealing the semiconductor chip and parts of the plurality of terminals,
wherein
an upper surface of the sealing resin is a flat heat radiation surface,
the plurality of terminals respectively protrude from first and second side surfaces of the sealing resin that oppose each other,
a distal end portion of each terminal has a substrate bonding surface positioned below a lower surface of the sealing resin,
each terminal exists below the heat radiation surface and includes a folded portion, and
the plurality of terminals include a control terminal protruding from the first side surface, and a main terminal protruding from the second side surface and having a width larger than a width of the control terminal;
a substrate bonded to the substrate bonding surface of the semiconductor package with a bonding material interposed therebetween; and
a heat sink attached to the heat radiation surface of the semiconductor package,
wherein a spacing between the substrate and the heat sink on the control terminal side is narrower than a spacing between the substrate and the heat sink on the main terminal side.

21. A semiconductor device comprising:
a semiconductor package comprising:
- a semiconductor chip;
- a plurality of terminals connected to the semiconductor chip; and
- insulating sealing resin sealing the semiconductor chip and parts of the plurality of terminals, wherein
- an upper surface of the sealing resin is a flat heat radiation surface,
- the plurality of terminals respectively protrude from first and second side surfaces of the sealing resin that oppose each other,
- a distal end portion of each terminal has a substrate bonding surface positioned below a lower surface of the sealing resin,
- each terminal includes at least two bending portions existing below the heat radiation surface and bent downward, and
- angles of the bending portions are obtuse angles;

a substrate bonded to the substrate bonding surface of the semiconductor package with a bonding material interposed therebetween; and a heat sink attached to the heat radiation surface of the semiconductor package, wherein the heat sink is provided with a groove in a portion opposing the terminal of the semiconductor package.

* * * * *